United States Patent
Lee

(10) Patent No.: US 6,730,602 B2
(45) Date of Patent: May 4, 2004

(54) METHOD FOR FORMING ALUMINUM BUMPS BY SPUTTERING AND CHEMICAL MECHANICAL POLISHING

(75) Inventor: Cheng-Wei Lee, Hsin-Chu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 110 days.

(21) Appl. No.: 09/822,532

(22) Filed: Mar. 30, 2001

(65) Prior Publication Data

US 2002/0142604 A1 Oct. 3, 2002

(51) Int. Cl.[7] .............................................. H01L 21/20
(52) U.S. Cl. ..................... 438/690; 438/691; 438/692; 438/693; 438/745; 438/756; 438/757

(56) References Cited

U.S. PATENT DOCUMENTS

| | | | | |
|---|---|---|---|---|
| 4,980,034 A | * | 12/1990 | Volfson et al. | 204/38.4 |
| 5,976,710 A | * | 11/1999 | Sachdev et al. | 428/620 |
| 6,181,569 B1 | * | 1/2001 | Chakravorty | 361/761 |
| 6,383,916 B1 | * | 5/2002 | Lin | 438/637 |

OTHER PUBLICATIONS

S. Wolf, "Silicon Processing for the VLSI Era", Lattice Press, vol. 1, 1986, pp. 589.*

* cited by examiner

Primary Examiner—Robert Kunemund
(74) Attorney, Agent, or Firm—Tung & Associates

(57) ABSTRACT

A method for forming aluminum bumps by first sputter aluminum and then chemical mechanical polishing to remove excess aluminum is disclosed. In the method, a pre-processed electronic substrate which has a plurality of I/O pads formed on top is first provided. An insulating material layer such as $SiO_2$, $Si_3N_4$, SOG or polyimide is then deposited on the pads to a thickness that is essentially the thickness of the aluminum bumps to be formed. A plurality of openings with one on each of the plurality of I/O pads is then photolithographically formed, followed by a sputtering deposition to fill the plurality of openings with a metal that includes aluminum. A chemical mechanical polishing technique is then used to remove the excess aluminum so that a top surface of the aluminum bump is flush with the top surface of the insulating material layer, followed by the final step of removing at least partially a thickness of the insulating material layer by a wet etch process.

20 Claims, 3 Drawing Sheets

1. Pad open

2. TiW deposition

3. Au deposition

4. PR coating

5. PR patterning

6. Gold plating

7. PR stripping

8. Gold etching

9. TiW etching

1. Thick passivation deposition

2. Pad opening

3. Al deposition

4. Al polishing

5. Pass. dip back

METHOD FOR FORMING ALUMINUM BUMPS BY SPUTTERING AND CHEMICAL MECHANICAL POLISHING

FIELD OF THE INVENTION

The present invention generally relates to a method for forming aluminum bumps and more particularly, relates to a method for forming aluminum bumps by a method that requires substantially reduced number of processing steps which includes sputtering and chemical mechanical polishing.

BACKGROUND OF THE INVENTION

In the fabrication of semiconductor devices, the ever increasing device density and the decreasing device dimensions demand more stringent requirements in the packaging or interconnecting techniques for such devices. In recent years, a flip chip attachment method has been widely used in the packaging of semiconductor chips. In the flip chip attachment method, instead of attaching a semiconductor die to a lead frame in a package, an array of bumps is first formed on the surface of the die. The formation of the bumps may be carried out by a variety of methods depending on the electrically conductive material that is used to form the bumps. For instance, evaporation, electrodeposition, stencil printing, screen printing have all been used to form electrically conductive bumps on flip chips.

The more frequently utilized bump fabrication techniques are a metal deposition process and a plating process. To carry out either of the processes, a series of barrier and seed layers of metal are first deposited on the surface of the semiconductor wafer. These layers are later removed by a wet etching process everywhere except under the die pads and the layers are used to improve adhesion of subsequent layers and to form a barrier to stop metal diffusion from the bump material to the underlying die pad. In a typical bump forming process, a layer of a photoresist material is then deposited over the surface of the semiconductor wafer. A photo mask is then used to pattern the locations over each of the die pads that a bump is to be formed. An etching process, such as plasma etching is used to expose the die pads, while the openings in the photoresist layer determines the shape and height of the bump to be formed.

The electrically conductive bump, which is typically formed of gold or aluminum, can be electroplated or sputtered over the die pad and the barrier and seed layers. Once the plating or sputtering step is completed, a series of wet etching steps is used to remove the photoresist layer and the various barrier and seed layers that cover the remainder area of the wafer while the bumps protect the underlying material from being etched. While gold is the most commonly used material, other electrically conductive materials such as copper, tin-lead and aluminum as well as layered composites of these materials can also be utilized.

A conventional method for forming gold bump is illustrated in FIGS. 1A~1I. As shown in FIG. 1A, an input/output (I/O) pad 12 formed on a semiconductor substrate 14 is first provided for a semiconductor structure 10. On top of the I/O pad 12, is then deposited a passivation layer 16 of an insulating material. The passivation layer 16 is formed by a photolithographic method using a mask (not shown) to provide an opening 18 for the I/O pad 12. In the next step of the process, as shown in FIG. 1B, a diffusion barrier layer 20 of TiW is conformally deposited into the pad opening 18. On top of the TiW barrier layer 20, is then deposited a gold seed layer 22, as shown in FIG. 1C. Both the TiW barrier layer and the Au seed layer may be suitably deposited by using a sputtering technique or an electroplating technique. On top of the semiconductor structure 10, is then coated, most likely by a spin coating technique, a thick photoresist layer 24.

In the next step of the process, as shown in FIG. 1E, the photoresist layer 24 is patterned by a mask (not shown) and an opening 26 is formed by a dry etching method such as plasma etching. The opening 26 is then filled, by an electroplating process of Au, as shown in FIG. 1F. The photoresist layer 24 is then stripped by a dry etching method leaving the Au bump 28 exposed on the semiconductor 10. In the next two steps of the process, as shown in FIGS. 1H and 1I, the gold seed layer 22 is etched away by a wet etch method and then, the TiW barrier layer 20 is etched away by a wet etch method exposing only the gold bump 28 above the passivation layer 16.

The conventional gold bump forming process requires numerous photolithographic steps, numerous deposition steps and various dry etching and wet etching steps. It is a time consuming and laborious process which severely impacts the yield of the semiconductor device.

It is therefore an object of the present invention to provide a method for forming aluminum bumps that does not have drawbacks or shortcomings of the conventional bump forming techniques.

It is another object of the present invention to provide a method for forming aluminum bumps by a substantially simplified process that only requires five process steps.

It is a further object of the present invention to provide a method for forming aluminum bumps by sputtering aluminum into a plurality of openings for the bumps.

It is still another object of the present invention to provide a method for forming aluminum bumps by first sputtering aluminum into a plurality of openings and then chemical mechanical polishing to remove excess aluminum from the openings.

It is yet another further object of the present invention to provide a method for forming aluminum bumps that only requires a single photolithographic patterning process.

It is yet another object of the present invention to provide a method for forming aluminum bumps by first sputtering aluminum into a plurality of openings and then chemical mechanical polishing to remove excess aluminum from the openings.

It is yet another further object of the present invention to provide a method for forming aluminum bumps that only requires a single photolithographic patterning process, an aluminum sputtering process, a CMP process and a wet etch process.

SUMMARY OF THE INVENTION

In accordance with the present invention, a method for forming aluminum bumps by sputtering and chemical mechanical polishing is provided.

In a preferred embodiment, a method for forming aluminum bumps by sputtering and chemical mechanical polishing (CMP) can be carried out by the operating steps of providing a pre-process electronic substrate with a plurality of input/output (I/O) pads formed on a top surface; depositing an insulating material layer on top of the plurality of I/O pads to a thickness that is essentially the thickness of the aluminum bumps to be formed; photolithographically forming a plurality of openings with one on each of the plurality of I/O pads; sputter depositing a metal comprising Al filling the plurality of openings and covering a top surface of the insulating material layer; chemical mechanical polishing the electronic substrate until a plurality of Al bumps are formed with a top surfaces of the bump flush with the top surface of the insulating material layer; and removing at least partially a thickness of the insulating material layer by a wet etch process.

The method for forming aluminum bumps by sputtering and chemical mechanical polishing may further include the step of forming the plurality of I/O pads in a metal that includes Al, or the step of depositing the insulating material layer to a thickness of at least 5 $\mu$m, or the step of depositing the insulating material layer from the group consisting of silicon oxide, spin-on-glass and polyimide. The method may further include the step of depositing the insulating material layer by at least two layers of different materials, or the step of depositing the insulating material layer by a first layer of $Si_3N_4$ or $SiO_2$ and a second layer of polyimide on top of the first layer. The method may further include the step of depositing the insulating material layer by at least two layers of different materials to a total thickness of at least 5 $\mu$m, or to a total thickness of between about 5 $\mu$m and about 10 $\mu$m. The method may further include the step of sputter depositing a metal that consists of Al and Cu, or a material that consists of Al and less than 3 wt. % Cu. The method may further include the step of conducting the wet etch process incorporating buffered oxide etch (BOE).

The present invention is further directed to a method for forming aluminum bumps on a semiconductor structure that includes the steps of providing a preprocessed semiconductor structure with a plurality of I/O pads on top; printing a layer of polyimide-containing material that has a thickness of at least 5 $\mu$m on top of the structure forming a plurality of openings on each of the pluralities of I/O pads exposed; filling the plurality of openings with a metal that includes Al; removing excess metal from areas other than the plurality of opening; and removing at least partially the layer of polyimide-containing material by a wet etch process.

The method for forming aluminum bumps on a semiconductor structure may further include the step of forming the plurality of I/O pads in a metal that includes Al, or the step of printing the layer of polyimide-containing material by a screen printing or stencil printing technique, or the step of printing the layer of polyimide-containing material to a thickness between about 5 $\mu$m and about 10 $\mu$m. The method may further include the step of filling the plurality of openings with a metal that includes Al and Cu. The method may further include the step of removing excess metal until a surface of the metal in the plurality of openings is flush with a top surface of the layer of polyimide-containing material. The method may further include the step of removing at least partially the layer of polyimide-containing material by an etchant that includes HF and $NH_4F$. The method may further include the step of removing at least ½ of a total thickness of the layer of polyimide-containing material to facilitate bonding to the aluminum bumps formed in the plurality of openings, or the step of removing completely the layer of polyimide-containing material to facilitate bonding.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming aluminum bumps by sputtering and chemical mechanical polishing in a greatly simplified process than that of the conventional process used in forming bumps.

In the present invention method, a pre-process electronic substrate that has a plurality of I/O pads formed on top is first provided. An insulating material layer is then deposited on top of the plurality of I/O pads to a thickness that is substantially the thickness of the aluminum bumps to be formed. A plurality of openings is then photolithographically formed on each of the plurality of I/O pads. A metal that includes Al is then sputter deposited to fill the plurality of openings and to cover a top surface of the insulating material layer. The electronic substrate is then chemical mechanical polished until a plurality of aluminum bumps is formed with the top surface of the bump flush with the top surface of the insulating material layer. At least partially the thickness of the insulating material layer is then removed by a wet etch process to expose the aluminum bump.

The invention further discloses a method for forming aluminum bumps on a semiconductor structure by first providing a preprocessed semiconductor structure that has a plurality of I/O pads on top. A layer of polyimide-containing material is then printed by either a screen printing or a stencil printing technique to a thickness of at least 5 µm on top of the structure forming a plurality of openings corresponding to each of the location of the plurality of I/O pads. The plurality of openings is then filled with a metal that includes Al, followed by a removal process for removing excess metal from areas other than the plurality of openings by a chemical mechanical polishing process, and then removing at least partially the layer of polyimide-containing material by a wet etch process.

When compared to a traditional bump forming process which requires a complicated process with approximately 15 different steps, the present invention provides a greatly simplified bump forming method that requires only about five steps. Moreover, the conventional bump forming process cannot be integrated into a standard CMOS process which further increases the complexity and cost of bump forming. The present invention provide a greatly simplified method by using aluminum CMP and passivation etch back to form aluminum bumps. Only five major steps are required which can be easily integrated into a standard CMOS process at low cost.

By utilizing the present invention novel process, a thick passivation layer deposition and aluminum CMP are used to first form a level surface of Al and passivation, and then a wet etch method utilizing buffered HF etchant to etch back the passivation layer to form the aluminum bumps.

Figure 1A:
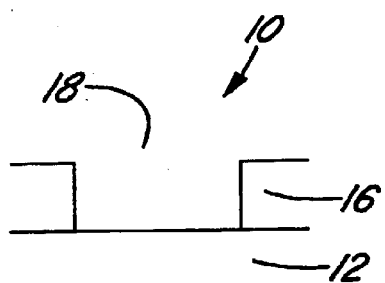
FIG. 1A is an enlarged, cross-sectional view of a pre-processed semiconductor structure for forming Au bumps by a conventional method.
Figure 1B:
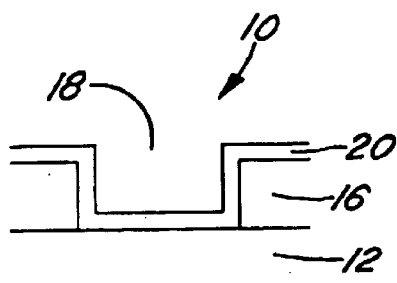
FIG. 1B is an enlarged, cross-sectional view of the semiconductor structure of FIG. 1A with a barrier layer of TiW conformally deposited on top.
Figure 1C:
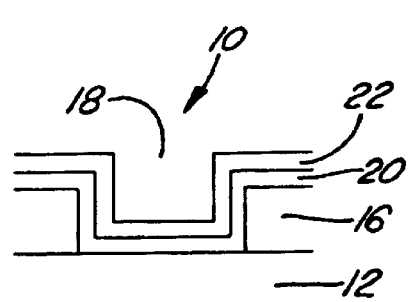
FIG. 1C is an enlarged, cross-sectional view of the conventional semiconductor structure of FIG. 1B with a gold seed layer deposited on top.
Figure 1D:
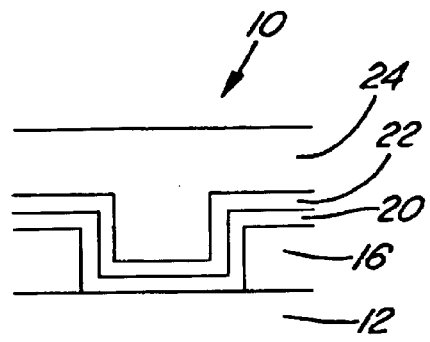
FIG. 1D is an enlarged, cross-sectional view of the conventional semiconductor structure of FIG. 1C with a thick photoresist layer deposited on top.
Figure 1E:
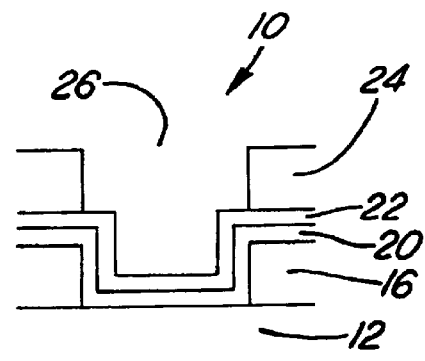
FIG. 1E is an enlarged, cross-sectional view of the conventional semiconductor structure of FIG. 1D with the photoresist layer patterned.
Figure 1F:
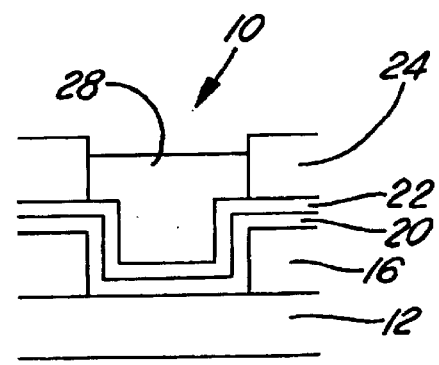
FIG. 1F is an enlarged, cross-sectional view of the conventional semiconductor structure of FIG. 1E with gold electroplated in the opening for the bump.
Figure 1G:
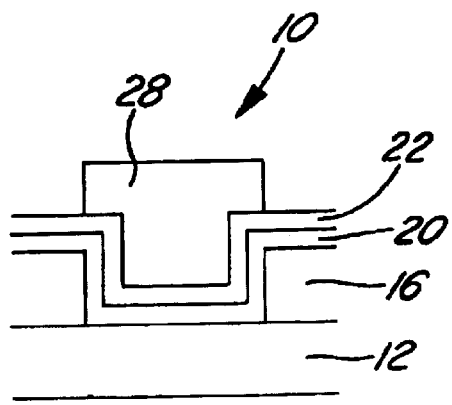
FIG. 1G is an enlarged, cross-sectional view of the conventional semiconductor structure of FIG. 1F with the photoresist layer removed.
Figure 1H:
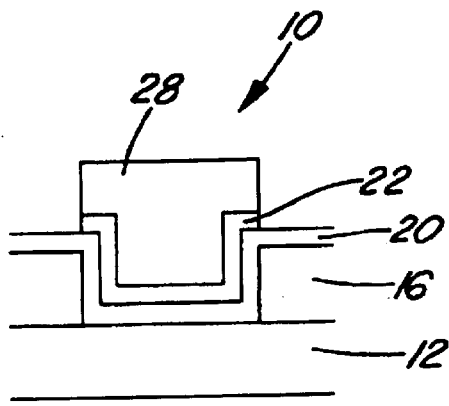
FIG. 1H is an enlarged, cross-sectional view of the conventional semiconductor structure of FIG. 1G with the Au seed layer removed.
Figure 1I:
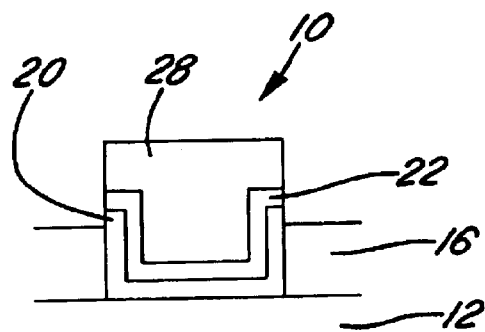
FIG. 1I is an enlarged, cross-sectional view of the conventional semiconductor structure of FIG. 1H with the TiW barrier layer removed.
Figure 2A:
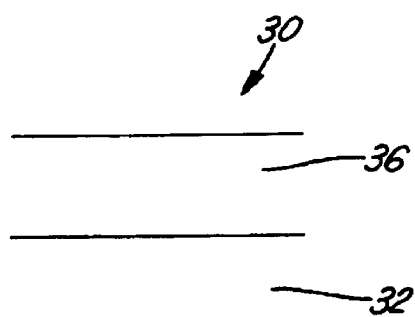
FIG. 2A is an enlarged, cross-sectional view of a present invention semiconductor structure with a passivation layer formed on an I/O pad.
Figure 2B:
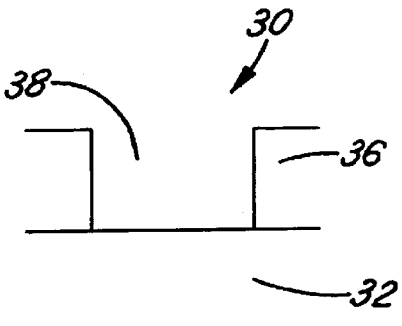
FIG. 2B is an enlarged, cross-sectional view of the present invention semiconductor structure of FIG. 2A with the passivation layer patterned to provide an opening over the I/O pad.

Referring now to FIG. 2A wherein a present invention semiconductor structure 30 is shown. The semiconductor structure 30 is first formed by depositing and forming an I/O pad 32 on top of a pre-processed semiconductor structure 34. The I/O pad 32 can be advantageously formed of aluminum, or of an aluminum alloy such as one that contains a small amount of copper. On top of the I/O pad 32, is then deposited an insulating material layer to a thickness that is substantially the thickness of the aluminum bumps to be formed, i.e. a thickness that is at least 5 µm, or in a range between about 5 µm and about 10 µm. A suitable insulating material layer can be a material selected from the group consisting of silicon oxide, spin-on-glass, silicon nitride and polyimide. The insulating material layer may further be formed by at least two layers of different materials. For instance, by a first layer of $Si_3N_4$ or $SiO_2$, and by a second layer of polyimide deposited on top of the first layer of $Si_3N_4$ or $SiO_2$. When two layers of different materials are utilized, the total thickness of the two layers is at least 5 µm, or in the range between about 5 µm and about 10 µm.

Figure 2C:
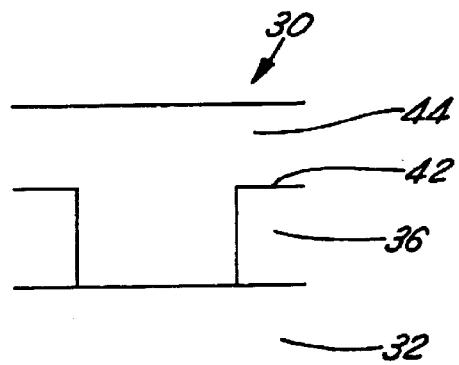
FIG. 2C is an enlarged, cross-sectional view of the present invention semiconductor structure of FIG. 2B with aluminum sputter deposited on top and filling the opening.

As shown in FIG. 2A, on top of the I/O pad layer 32, is then deposited an insulating material layer 36 as previously described. The insulating material layer 36 is patterned by using a mask (not shown) forming an opening 38 for the aluminum bump to be formed. In the next step of the process as shown in FIG. 2C, a metal that includes aluminum is sputter deposited to fill the opening 38 and to cover a top surface 42 of the insulating material layer 32. The aluminum layer 44 may be deposited of a metal that consists of aluminum and copper, or a metal that consists of aluminum and less that 3 wt. % copper.

Figure 2D:
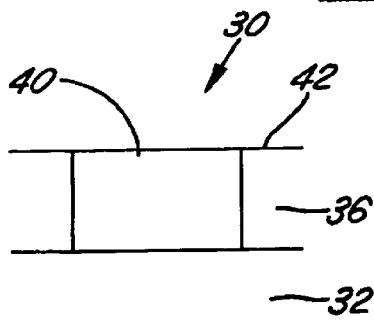
FIG. 2D is an enlarged, cross-sectional view of the present invention conventional semiconductor structure of FIG. 2C with the aluminum bump formed by a chemical mechanical polishing process.
Figure 2E:
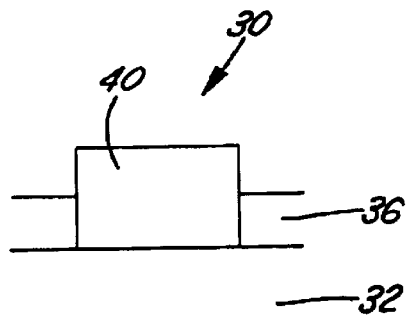
FIG. 2E is an enlarged, cross-sectional view of the present invention semiconductor structure of FIG. 2D with the passivation layer partially removed in a wet etch.

The sputter deposited aluminum layer 44 is then polished by a chemical mechanical polishing technique removing excess aluminum and forming an aluminum bump 40, as shown in FIG. 2D. In the next and last step of the process, the insulating material layer 36 can be either partially (as shown in FIG. 2E) or completely (not shown) removed to expose the aluminum bump 40. The exposure of the aluminum bump 40 facilitates the future bonding of the bump to other conductive pads. The partial removal of the insulating material layer 36 can be carried out in a wet etch process. Typically, an etchant such as buffered oxide etch (BOE) may be suitably used which contains HF that is buffered by $NH_4F$.

The present invention novel method for forming aluminum bumps by sputtering aluminum in a plurality of openings and then chemical mechanical polishing to remove excess aluminum has therefore been amply described in the above description and in the appended drawings of FIGS. 2A~2E.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming aluminum bumps by sputtering and chemical mechanical polishing comprising the steps of:

providing a pre-processed electronic substrate with a plurality of input/output (I/O) pads formed on a top surface;

depositing an insulating material layer on top of said plurality of I/O pads to a thickness that is substantially the thickness of Al bumps to be formed;

photolithographically forming a plurality of openings with one on each of said plurality of I/O pads;

sputter depositing a metal comprising Al filling said plurality of openings and covering a top surface of said insulating material layer;

chemical mechanical polishing said electronic substrate until a plurality of Al bumps is formed with a top surface of the bump flush with said top surface of the insulating material layer; and removing at least partially a thickness of said insulating material layer by a wet etch process.

2. A method for forming aluminum bumps by sputtering and chemical mechanical polishing according to claim 1 further comprising the step of forming said plurality of I/O pads in a metal comprising Al.

3. A method for forming aluminum bumps by sputtering and chemical mechanical polishing according to claim 1 further comprising the step of depositing said insulating material layer of a thickness of at least 5 µm.

4. A method for forming aluminum bumps by sputtering and chemical mechanical polishing according to claim 1 further comprising the step of depositing said insulating material layer of a material selected from the group consisting of silicon oxide, spin-on-glass and polyimide.

5. A method for forming aluminum bumps by sputtering and chemical mechanical polishing according to claim 1 further comprising the step of depositing said insulating material layer by at least two layers of different materials.

6. A method for forming aluminum bumps by sputtering and chemical mechanical polishing according to claim 1 further comprising the step of depositing said insulating material layer by a first layer of $Si_3N_4$ or $SiO_2$ and a second layer of polyimide on top of said first layer.

7. A method for forming aluminum bumps by sputtering and chemical mechanical polishing according to claim 1 further comprising the step of depositing said insulating material layer by at least two layers of different materials to a total thickness of at least 5 µm.

8. A method for forming aluminum bumps by sputtering and chemical mechanical polishing according to claim 1 further comprising the step of depositing said insulating material layer by at least two layers of different materials to a total thickness between about 5 µm and about 10 µm.

9. A method for forming aluminum bumps by sputtering and chemical mechanical polishing according to claim 1 further comprising the step of sputter depositing a metal that consists of Al and Cu.

10. A method for forming aluminum bumps by sputtering and chemical mechanical polishing according to claim 1 further comprising the step of sputter depositing a metal that consists of Al and less than 3 wt. % Cu.

11. A method for forming aluminum bumps by sputtering and chemical mechanical polishing according to claim 1 further comprising the step of conducting said wet etch process incorporating buffered oxide etch (BOE).

12. A method for forming aluminum bumps on a semiconductor structure comprising the steps of:
   providing a pre-proceased semiconductor structure with a plurality of I/O pads on top;
   printing a layer of polyimide-containing material having a thickness of at least 5 µm on top of said structure;
   forming a plurality of openings on each of said plurality of I/O pads exposed;
   filling said plurality of openings with a metal comprising Al;
   removing excess metal from areas other than said plurality of openings; and
   removing at least partially said layer of polyimide-containing material by a wet etch process.

13. A method for forming aluminum bumps on a semiconductor structure according to claim 12 further comprising the step of forming said plurality of I/O pads in a metal comprising Al.

14. A method for forming aluminum bumps on a semiconductor structure according to claim 12 further comprising the step of printing said layer of polyimide-containing material by a screen printing or stencil printing technique.

15. A method for forming aluminum bumps on a semiconductor structure according to claim 12 further comprising the step of printing said layer of polyimide-containing material to a thickness between about 5 µm and about 10 µm.

16. A method for forming aluminum bumps on a semiconductor structure according to claim 12 further comprising the step of filling said plurality of openings with a metal comprising Al and Cu.

17. A method for forming aluminum bumps on a semiconductor structure according to claim 12 further comprising the step of removing excess metal until a surface of said metal in the plurality of openings is flush with a top surface of said layer of polyimide-containing material.

18. A method for forming aluminum bumps on a semiconductor structure according to claim 12 further comprising the step of removing at least partially said layer of polyimide-containing material by an etchant comprising HE and $NH_4F$.

19. A method for forming aluminum bumps on a semiconductor structure according to claim 12 further comprising the step of removing at least ½ of a total thickness of said layer of polyimide-containing material to facilitate bonding to said Al bumps formed in said plurality of openings.

20. A method for forming aluminum bumps on a semiconductor structure according to claim 12 further comprising the step of removing completely said layer of polyimide-containing material to facilitate bonding to said Al bumps formed in said plurality of openings.

* * * * *